United States Patent [19]

Ash et al.

[11] 4,402,799

[45] Sep. 6, 1983

[54] APPARATUS AND METHOD OF TREATING TABS OF PRINTED CIRCUIT BOARDS AND THE LIKE

[75] Inventors: James J. Ash, Centre Hall; Joseph M. Brady, Huntingdon, both of Pa.; Daniel L. Goffredo, Riverton, N.J.; Conrad D. Shakley, Spring Mills, Pa.

[73] Assignee: Chemcut Corporation, State College, Pa.

[21] Appl. No.: 307,687

[22] Filed: Oct. 2, 1981

[51] Int. Cl.³ .................. C25D 5/02; C25D 17/06; C25D 17/28

[52] U.S. Cl. ............................ 204/15; 204/202; 204/224 R

[58] Field of Search ............... 204/15, 224 R, 198, 204/202

[56] References Cited

U.S. PATENT DOCUMENTS

| | | | |
|---|---|---|---|
| 2,708,181 | 5/1955 | Holmes | 204/28 |
| 3,575,829 | 4/1971 | Germain | 204/28 |
| 3,616,423 | 10/1971 | Faust | 204/198 |
| 3,649,507 | 3/1972 | Welter | 204/202 |
| 3,657,097 | 4/1972 | Baldock | 204/202 |
| 3,723,283 | 3/1973 | Johnson | 204/206 |
| 3,746,630 | 7/1973 | Kosowsky | 204/206 |
| 3,799,861 | 3/1974 | Di Pietro | 204/279 |
| 3,848,326 | 11/1974 | Lehtovaara | 204/198 |
| 3,898,151 | 8/1975 | Nessar | 204/300 |
| 3,933,615 | 1/1976 | Levenson | 204/275 |
| 3,951,761 | 4/1976 | Bohringer | 204/15 |
| 3,966,581 | 6/1976 | Holte | 204/202 |
| 3,970,540 | 7/1976 | McBain | 204/297 W |
| 3,982,321 | 9/1976 | Kasper | 204/198 |
| 3,996,127 | 12/1976 | Rautimo | 204/281 |
| 4,003,805 | 1/1977 | Schaer | 204/224 R |
| 4,029,564 | 6/1977 | Higuchi | 204/224 R |
| 4,029,564 | 6/1977 | Higuchi | 204/224 R |
| 4,035,245 | 7/1977 | Danneels | 204/15 |
| 4,064,019 | 12/1977 | Eidschun | 204/15 |
| 4,077,865 | 3/1978 | Muller | 204/297 W |
| 4,078,982 | 3/1978 | Eidschun | 204/224 R |
| 4,124,454 | 11/1978 | Shang | 204/27 |
| 4,132,617 | 1/1979 | Noz | 204/206 |
| 4,155,815 | 5/1979 | Francis | 204/15 |
| 4,160,703 | 7/1979 | Bird | 204/15 |
| 4,162,952 | 7/1979 | Tribout | 204/224 R |
| 4,162,955 | 7/1979 | Schregenberger | 204/299 EC |
| 4,176,035 | 11/1979 | Pedone | 204/205 |
| 4,186,062 | 1/1980 | Eidschun | 204/15 |
| 4,217,919 | 8/1980 | Faunce | 204/198 |
| 4,236,990 | 12/1980 | King | 204/275 |
| 4,244,833 | 1/1981 | Tomaszewski | 204/101 |

FOREIGN PATENT DOCUMENTS

| | | |
|---|---|---|
| 32530A | 11/1980 | European Pat. Off. |
| 2856460 | 7/1980 | Fed. Rep. of Germany ....... 204/15 |
| 3001726 | 3/1981 | Fed. Rep. of Germany ....... 204/15 |

*Primary Examiner*—T. M. Tufariello
*Attorney, Agent, or Firm*—Paul & Paul

[57] ABSTRACT

Printed circuit boards are carried generally vertically, along a path, with the tabs at the lower end being immersed in an electrolyte. The boards are automatically conveyed through opposed serially arranged pairs of rollers, which drive them along their path. Brushes wipe the boards to prevent contact with electrolyte above the desired contact level, as they are conveyed along the path. The solution is constantly replenished and turbulence provided by delivering electrolyte solution, with insoluble metallic ions in it, by pumping the solution from a sump, through an array of nozzles along each side of the path, thus providing fresh electrolyte along with providing turbulence to the electrolyte. The nozzles are charged at a sufficiently low level to avoid their destruction. Electrical contact is made with the printed circuit boards, by means of serially engaging the boards with spring fingers of a continuous conductor along each side of the boards as they are conveyed along their path, and thereby conducting the applied charge to the immersed tabs, whereby the tabs function as cathodes for electrodeposition of metallic ions thereon. The drive for the boards is provided by means of opposed pairs of rollers. One roller in each pair is a driving roller, with the opposing roller functioning as an idler, but forming an interference fit between the rollers as the boards are carried therebetween.

20 Claims, 6 Drawing Figures

APPARATUS AND METHOD OF TREATING TABS OF PRINTED CIRCUIT BOARDS AND THE LIKE

BACKGROUND OF THE INVENTION

In the art of printed circuit board manufacture, it is known to plate tabs of the boards with various substances, particularly gold, and generally after first nickel plating prior to gold striking and plating, for the purpose of obtained better resistivity, high conductivity at the connection points defined in the tabs, and high corrosion resistance. Such techniques have frequently experienced problems in driving the printed circuit boards, positively along their path, and in satisfactorily applying the electrolyte to the tabs, in sufficient density, during the residence time of the tabs in the solution.

SUMMARY OF THE INVENTION

The present invention is addressed to making good electrical contact with the printed circuit boards, to positively driving the boards along the board path, with their tabs immersed, and to delivering the electrolyte to the vicinity of the tabs, by means of delivery nozzles located along the tab path, with the nozzles functioning as electrodes.

Accordingly, it is a primary object of this invention to provide a novel electroplating apparatus, for electroplating tabs of printed circuit boards.

It is a further object of this invention to accomplish the above object, wherein the electroplating of the tabs, involves the electrodeposition of gold onto the tabs.

It is another object of this invention to accomplish the methods established by the apparatus discussed above.

It is another object of this invention, to provide for adjustability with respect to the drive of boards through their paths, whereby boards of different thicknesses may be accommodated.

It is a further object of this invention to make electrical contact with printed circuit boards, at their upper ends, outside of contact with the electrolyte, but to provide for adjustability of such contact, in order to accommodate boards of various heights.

It is another object of this invention to deliver printed circuit boards along their paths through treatment stations.

It is another object of this invention to accomplish the above objects, wherein the boards are appropriately guided during their movement along the path.

Other objects and advantages of the present invention will be readily apparent to those skilled in the art by reading of the following brief descriptions of the drawing figures, detailed descriptions of the preferred embodiments and the appended claims.

BRIEF DESCRIPTIONS OF DRAWING FIGURES

FIG. 1, is a vertical sectional view, taken longitudinally through the apparatus of this invention, generally along the line I—I of FIG. 2, and wherein a number of printed circuit boards are shown, being conveyed from right to left as viewed in FIG. 1, with the tabs at the lower ends of the boards at a level for immersion in the electrolyte bath, and with the illustration in FIG. 1, being broken, to shorten the same longitudinally as a drafting expedient.

DETAILED DESCRIPTIONS OF THE PREFERRED EMBODIMENTS

Figure 1:
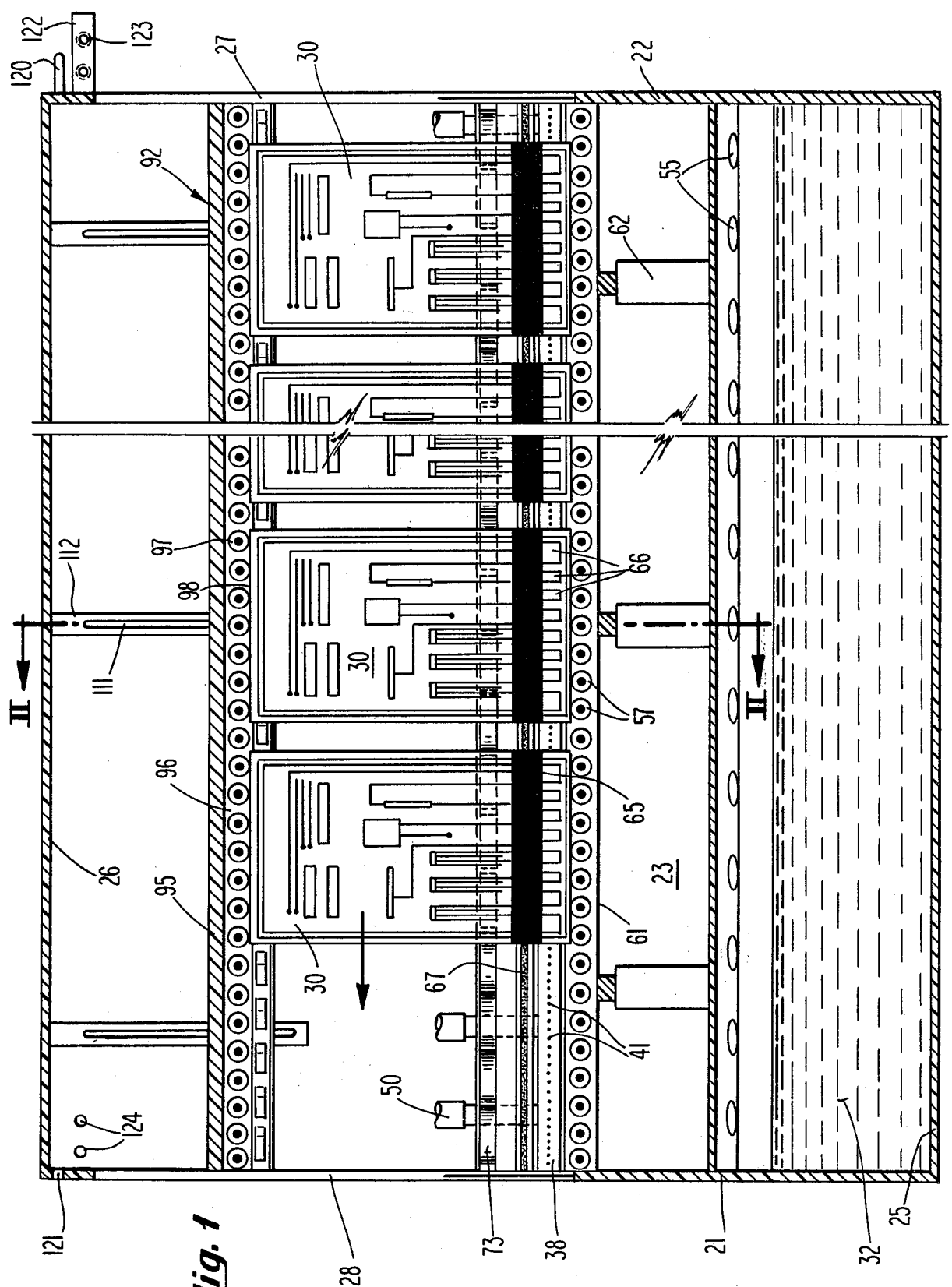

Referring now to the drawings in detail, reference is first made to FIG. 1, wherein the tab plating apparatus is generally designated by the numeral 20 as comprising left and right end walls 21 and 22, side walls 23 and 24, sump bottom 25, and top cover 26. Elongated vertical slots 27 and 28 are provided in walls 22 and 21, respectively, for accommodating ingress and egress of printed circuit boards 30, being received with the apparatus 20, and being delivered therefrom, in the direction of flow, along the predetermined path that will be apparent hereinafter, and as indicated by arrow 31 in FIG. 1.

The electrolyte 32, is present in the sump defined by the walls 21 through 24, and sump bottom 25.

Electrolyte is pumped from the sump 32, by means of pumps (not shown) located in the sump 32, and delivered, up through delivery lines 33 and 34, located inside, but close to the walls 24 and 23, respectively, to respectively associated manifolds 35 and 36. A plurality of such lines 33 or 34, deliver electrolyte to the manifolds 35 and 36.

Figure 2:
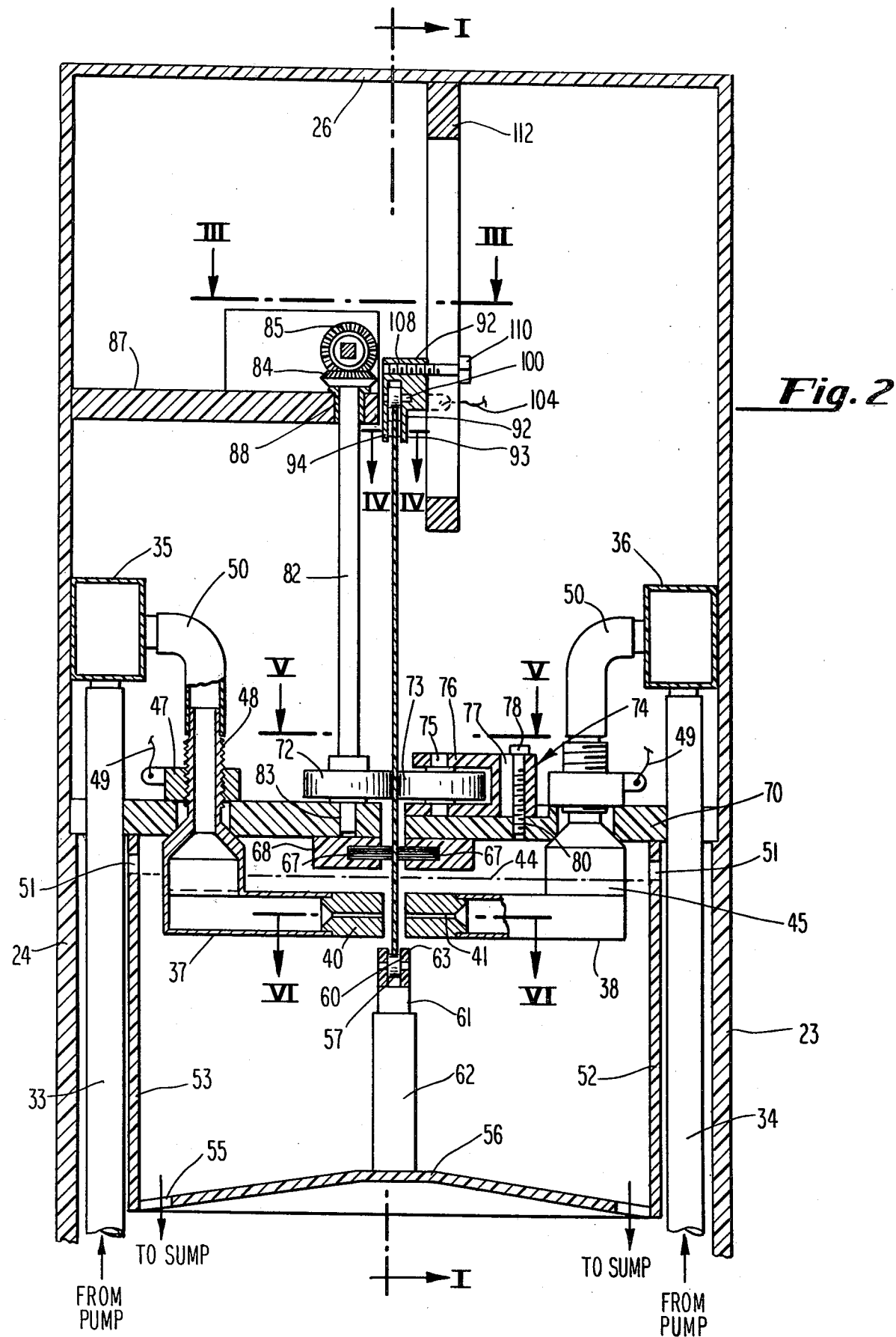
FIG. 2 is a transverse vertical sectional view, of the apparatus of FIG. 1, taken generally along the line II—II of FIG. 1, wherein the board drive wheels, the nozzles, and the electrical contact means for the board, together with their adjustment, are all clearly illustrated.
Figure 3:
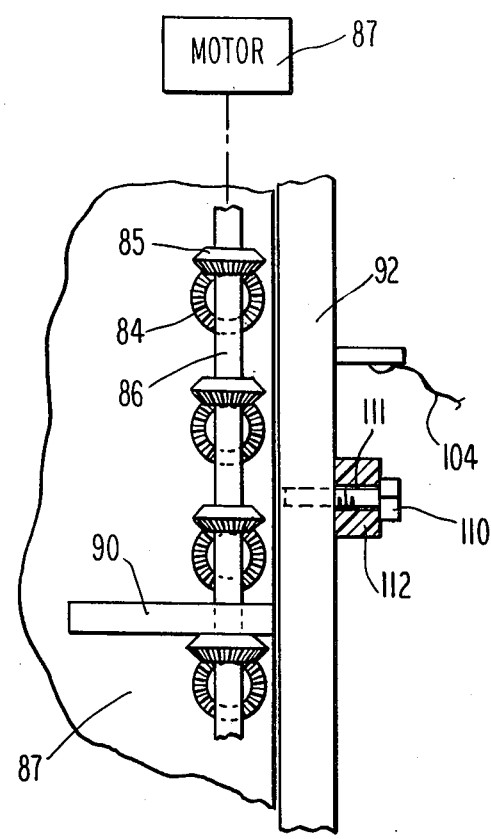
FIG. 3 is an enlarged fragmentary plain view of the drive apparatus, for driving the boards through their predetermined paths, and is taken generally along the line III—III of FIG. 2, with portions being illustrated in section.
Figure 4:
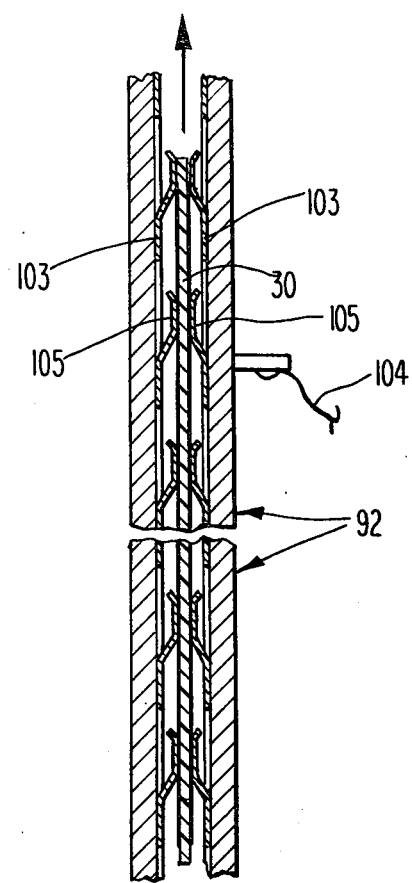
FIG. 4 is an enlarged fragmentary horizontal sectional view, with portions broken away for the sake of clarity, taken through the board-engaging conductors and their conducting spring fingers, with the view of FIG. 4 being taken generally along the line IV—IV of FIG. 2.
Figure 5:
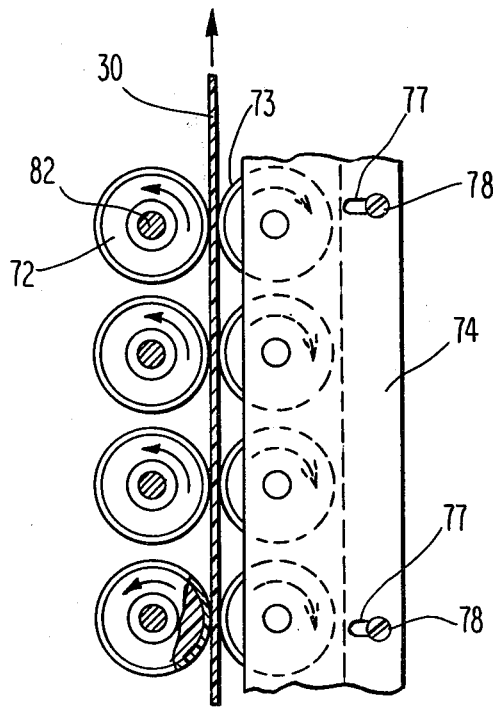
FIG. 5 is an enlarged fragmentary horizontal sectional view, taken through the apparatus of this invention, generally on line V—V of FIG. 2, and wherein the drive and idler wheels are illustrated for moving the board along its path, with the bank of idler wheels having means for adjustably positioning the wheels.
Figure 6:
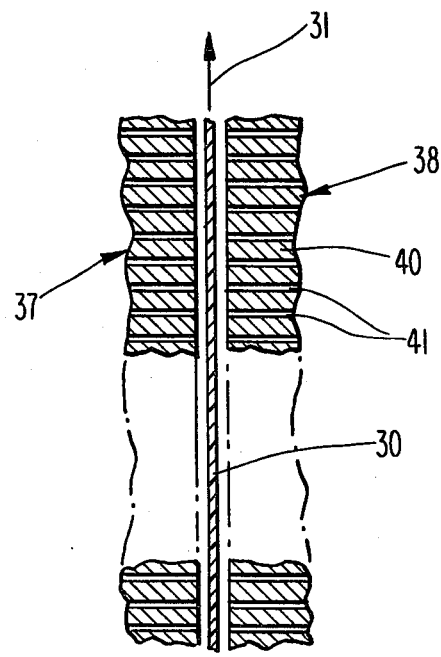
FIG. 6 is an enlarged fragmentary horizontal sectional view, taken through the board as it is being conveyed along its path through the electrolyte and with an array of nozzles being illustrated, in section, along each side of the board path.

Elongated arrays of nozzles banks 37 and 38 extend horizontally between inlet and outlet walls 22 and 21, as illustrated in FIGS. 1 and 2, each with nozzles 40 connected therewith and disposed along side the path of travel of the lower end of the printed circuit board 30 being delivered therepast, whereby electrolyte can be discharged through orifices 41 of the nozzles 40, to impinge upon both sides of the boards 30.

The nozzle banks 37 and 38, are located in the bath 43, below the liquid level 44 thereof, and are provided with electrolyte pumped under pressure, through suitable nipples 45, held in seated position in openings 46, by means of collars 47, in threaded engagement with threaded members 48, that in turn are in threaded engagement with elbows 50, that communicate with the manifolds 35 or 36.

Electrolyte is therefore delivered from the sump 32, via lines 33, 34, via manifolds 35, 36, via elbows 50, via members 48, via nipples 45, via nozzle banks 37, 38, and out through the orifices 41 of nozzles 40, while the nozzles 40 are immersed in electrolyte in the bath zone 43, below the level 44, and with the delivery of electrolyte through the nozzle orifices 41 serving to create a turbulence within the bath zone 43, for enhancing uniform distribution of insoluble ions carried in acid solution, throughout the bath zone 43.

It will be noted that the rate of flow of the electrolyte into the bath zone 43, is at a sufficiently high level, to maintain the liquid level 44, and that overflow ports 51, at the level 44, through walls 52 and 53 of the trough that forms the bath zone, enable return of electrolyte back into the sump 32, outside trough walls 52 and 53, for recirculation. Electrolyte return holes 55 may also be provided in the bottom wall 56 of the trough 54, for facilitating greater flowthrough of electrolyte into the sump 32, and to increase the agitation provided by electrolyte flow in the bath zone 43.

It will be noted that a plurality of lower guide rollers 57 are rotatingly carried on shafts 58, in an elongated groove 60, of a U-shaped track member 61, extending between the walls 22 and 21, and supported from the bottom 56 of the trough 54, by means of vertical standards 62. The rollers 57 function as idlers, and together with the upper inside portions of the upstanding legs 63, serve to guide the lower ends of the printed circuit boards 30, as they travel through the apparatus 20.

With particular reference to FIG. 1, it will be apparent that a masked portion or stripe 65, is provided, spaced upwardly slightly from the lower ends of each of the printed circuit boards. The mask 65 may be an adhesively secured sheet, or may be a paint-like substance that has been applied, where illustrated on the boards, across conductor portions of the boards, to define a zone, below which plating is desired, but above which plating is not desired. Accordingly, the mask zone 65 serves to restrict the passage of electrolyte to those portions of the boards 30 below the mask zones 65.

It will be noted that the nozzle orifices 41 are illustrated in FIG. 1 as being disposed at a level for plating of tab portions 66 of boards 30, as they are conveyed therepast.

At about the level of the mask zones 65 of the boards 30, it will be noted that longitudinally extensive wipers, 67 are provided. These wipers 67 are of the multiple filament brush type, constructed to be stiff, but yet to yieldably engage opposite sides of the printed circuit boards 30 being conveyed therepast, as illustrated in FIG. 2, and above the level 44 of electrolyte or bath, to wipe from the boards 30, in vicinity of the mask zones 65, any electrolyte that may have been spashed onto, or otherwise come into contact with the boards 30 in the zones of mask 65.

The wipers 67 extend generally longitudinally, between the walls 21 and 22, and are carried in suitable holders 68, of the transverse cross-section illustrated in FIG. 2. The holders 68 are carried on opposite sides of the path of board flow, at the lower ends of upper bath zone cover 70 and 71.

Pairs of opposed drive wheels 72 and 73 are provided, along the path of flow of printed circuit boards, between the inlet and exit openings 27 and 28, respectively, with the rollers 72, 73 being on opposite sides of the path, and with the roller 73 being the idler roller in each instance, and with the roller 72 being the drive roller in each instance, and with the spacings between rollers 72 and 73 being set relative to the thickness of a given printed circuit board 30, such that, in each instance, there is an interference fit between the rollers 72 and 73 when a printed circuit board 30 is disposed between them. In this instance, only one of the rollers 72 or 73 in each pair, needs to be driven. It will also be noted that the rolling surfaces of the rollers 72 and 73, are provided with a resilient nonconductive coating material, for assuring good grip with the printed circuit boards 30 during their conveyance through the apparatus 20.

The idler rollers 73 are carried in a suitable mounting block 74 of C-shaped cross section, by means of a shaft 75 extending between legs 76 and 77 of the mounting block 74. The block 74 has a plurality of slotted holes 77 therein, for receiving connector members 78 therethrough, with the lower ends of the connector members 78 being in threaded engagement at 80, in upper plate 70. It will be apparent that the mounting block 74 may be adjustably positioned, as desired, toward and away from the path of movement of printed circuit boards 30 between the rollers, such that the bank of rollers 73 may be moved closer to, or farther away from the rollers 72, by simple loosening of threaded members 78 and repositioning of the mounting block 74, as desired.

The drive rollers 72 are fixedly mounted, on drive shafts 82, lower ends of which are bushing-mounted at 83, in upper member 71, and with the shafts 82 being driven, for positively rotating the drive wheels 72.

The upper ends of the shafts 82 have bevel gears 84 carried thereon, that in turn are in meshed engagement with bevel gears 85 carried on main drive shaft 86, that, in turn, is driven by a suitable motor 87.

Horizontal support member 87, carried by wall 24, having bushings 88 therein, supports the upper ends of the shafts 82, and gears 84 carried thereon, as well as supporting shaft supports 90 that, in turn, journal the main drive shaft 86.

An upper guide track 92, is provided, constructed, so as, in transverse section, as viewed in FIG. 2, to be of inverted U-shaped cross section. The track 92 extends between inlet and outlet walls 22 and 21, respectively, of the apparatus 20, as illustrated in FIG. 1, and as provided with depending legs 93 and 94, connected by web 95. At the upper end of the opening 96 in the track 92, there are provided a plurality of upper guide rollers 97, for engaging the upper ends 98 of the boards 30, and guiding boards 30 in their movement along the path through the apparatus.

The rollers 97 are of the idler type, mounted for rotation on shafts 100, with protruding shaft portions in engagement with opposite legs 93, 94, of the track member 92.

Below the guide wheels 97, in the track 96, on each side of the path of movement of the printed circuit boards 30 therebetween, there are provided elongate continuous conductors 103, extending from one end wall 22 of the apparatus, to the other 21. These conductors 103 are electrically connected, each by means of suitable lead lines 104, through the track member 92, to conduct electricity to the upper ends of the printed circuit boards 30, through a plurality of serially disposed spring fingers 105, that are incompletely severed from the conductors 103, and extend inwardly to engage opposite sides of the printed circuit boards 30, as the boards are delivered therepast, with the spring fingers 105 being in biased engagement with the opposite side of the boards being delivered therebetween. The spring fingers 105 thus springingly engage the boards 30, and make electrical connection with the upper ends of the boards, along their conductive portions. The conductive portions of the upper ends of the boards conventionally communicate with the tabs 66 at the lower ends of the boards, as printed circuit boards are designed. In order to accommodate printed circuit boards 30 of varying vertical heights, the track 92 that houses the guide rollers 97 and the elongate conductors 103 therein, is capable of being adjustably positionable at various heights. To this end the track member 92 is provided with a plurality of tapped holes 108 therein, along its length, for receiving, in threaded engagement therein, a plurality of threaded connectors 110. The threaded connectors are adapted to be slidingly positionable along vertical slotted holes 111, in track support 112, that, in turn, is carried by upper wall 26. A sufficient number of track supports 112 are provided along the length of the track, to carry the same.

It will be apparent that the means for imparting electrical connection to the upper ends of the printed circuit boards, as well as the means for guiding the upper ends of the printed circuit boards, are therefore all capable of being adjustably positioned vertically, without disturbing the drive for the drive rollers 72.

The apparatus 20 may comprise a plurality of modules connected together, end-to-end, in accordance with the principles and connection means of U.S. Pat. No. 4,015,706. To this end, the modules may be provided with dowel pins 120, for alignment of modules one to the other, by insertion of the pins 120 into mating holes 121, of a next adjacent module. Also, mounting blocks 122 may be utilized, having tapped holes 123 therein, for connection by means of threaded members, of a module having a mounting block 122 along each side, with an adjacent end of a next-adjacent module, by means of the threaded members that engage the tapped holes 123, passing through holes 124 of a next-adjacent module. In this manner, connection and alignment means is provided, from module-to-module. Also, the drive rod 86 may be constructed to be substantially coextensive with the length of the apparatus 20, between walls 22 and 21 thereof, as a single drive rod. The ends of the drive rods may be likewise connected by a plugging type connector member, in accordance with the disclosure of U.S. Pat. No. 4,015,706, the diclosure of which is herein incorporated by reference.

A filter may be provided for the electrolyte in the sump 32, which filter may be movably disposed therein, in accordance with the disclosure of U.S. Pat. No. 3,776,800, the disclosure of which is incorporated by reference.

It will be apparent from the foregoing, that the conductor portions of the plates themselves 30, function as electrodes, with respect to those portions of the plates 30, that comprise the tab portions 66 that are to be electroplated. These tabs 66 will generally comprise the cathodes. The anodes will preferably be the nozzles 40, and preferably the complete nozzle banks 37, 38, and connector members 45 and 47, electrically connected to a suitable power source by means of the leads 49. It will further be understood that generally an AC power source will be utilized, converted by means of a rectifier (not shown) to a suitable source.

It will further be understood that, while the disclosure above is principally directed toward electroplating gold in the form of insoluble gold ions in the electrolyte, onto the tabs 66 of printed circuit boards, as part of the electroplating process, it will be understood that apparatus in accordance with the structure of apparatus 20 may be utilized to perform preliminary functions, prior to the actual gold electroplating. For example, solutions other than electrolytes may be utilized in apparatus 20, such as degreasing solutions, whereby the printed circuit boards would be delivered to a next adjacent module, where perhaps a nickel plating would take place, in accordance with the electroplating techniques taught herein. Thereafter, the gold electroplating may take place, followed by suitable rinsing, blow-drying operations, as may be necessary to complete the entire process.

It will also be understood that, with respect to the electrical connection with the printed circuit boards, at the upper ends, that suitable materials, may be employed. For example, the guides that form the track 92 may be of polypropylene construction, as desired, as may be the guide member 61 that forms the lower guide track.

It will be apparent also that various other modifications may be employed in the apparatus of this invention, for example, baffles may be utilized in the bath 43, for obtaining desired flow situations, as may be desired. Additionally, aside from those components that actually function as electrodes, the various components of this apparatus, particularly those in the bath and in the immediate vicinity of the bath, will either be coated with, or comprised of electrically nonconductive material.

It will also be apparent that while this process is directed toward electroplating gold onto tabs of plates, the equipment and techniques disclosed herein may be utilized for electroplating other metals onto printed circuit board portions, or even onto other members that are to be electroplated, if such other members have the necessary structural features to accommodate use in the apparatus of this invention. Accordingly, various modifications may be made in the details of construction, as well as in the use and operation, all within the spirit of the invention as defined in the appended claims.

What is claimed is:

1. Apparatus for localized electroplating of tabs of printed circuit boards and the like, comprising:
    means defining a bath zone of electrolyte;
    conveying means for conveying printed circuit boards such that tabs on lower ends thereof are carried through the bath zone, with the boards in generally upright disposition along a predetermined generally vertical path;
    delivery means for delivering a sufficient flow of electrolyte to the bath zone, to maintain a bath depth of a predetermined desired level;
    means disposed above said predetermined level, for wiping the printed circuit boards against electrolyte contact above the level of said wiping means;
    means automatically and serially engaging portions of the boards that are out of solution and making continuous electrical contact therewith as boards are conveyed through the solution, whereby the immersed board tabs function as electrodes;
    said delivery means including a bank of electrolyte delivery nozzles along said path;
    means making electrical connection with said nozzles, whereby said nozzles function as immersed electrodes;
    means for generating an electrical potential between said electrodes.

2. The apparatus of claim 1, wherein said nozzles are insoluble in an electrolyte and are anodically charged at a sufficiently low potential to avoid nozzle destruction.

3. The apparatus of claim 1, wherein said nozzles and wiping means are disposed both sides of the path of movement of boards thereby.

4. The apparatus of claim 1, wherein said wiping means comprise brushes of nonconductive material.

5. The apparatus of claim 1, wherein said conveying means comprise a plurality of opposed roller pairs along said path outside of said bath zone, with one roller of each said pair being mounted on each side of said path, for board engagement therebetween.

6. The apparatus of claim 5, wherein the opposed rollers of each said pair have resilient board-engaging surfaces and are mounted for rotation relative to each other to be in interference fit with a board upon receiving a board therebetween.

7. The apparatus of claim 5, wherein one roller in each said pair is a driving roller and the other roller in each said pair is an idler roller, with a plurality of said idler rollers being mounted for rotation in a common frame, and wherein means are provided for adjustably positioning said frame laterally toward and away from said path, for accommodating boards of different thicknesses.

8. The apparatus of claim 1, wherein said means for making electrical contact with the boards includes an elongate continuous conductor carried by mounting means on each side of the upper end of said board path, with said conductors each having a plurality of conductive spring fingers carried serially thereby and extending transversely into the path of the upper ends of said boards for making electrical engagement with said boards.

9. The apparatus of claim 1, including means for vertically adjustably positioning the means for making electrical contact with the upper ends of the boards, for accommodating boards of different heights.

10. The apparatus of claim 8, including means for vertically adjustably positioning the means for making electrical contact with the boards, for accommodating boards of different heights, wherein said elongate continuous conductors are carried in a track, and wherein said track is adjustably positionable vertically.

11. The apparatus of claim 1, including upper guide rollers for guiding the upper ends of the boards, in their movement along their path.

12. The apparatus of claim 1, including lower guide rollers for guiding the lower ends of the boards, in their movement along their path.

13. The apparatus of claim 10, including upper guide rollers for guiding the upper ends of the boards in their movement along their path, and wherein said rollers are disposed in said track, above said conductors.

14. The apparatus of claim 1, wherein said delivery means comprises overflow means for discharging electrolyte from said bath zone above the predetermined desired level, sump means for collecting electrolyte thus discharged, and pump means for pumping electrolyte from said sump means to said nozzles.

15. The apparatus of claim 2, wherein said nozzles and wiping means are disposed along both sides of the path movement of boards thereby, and wherein said wiping means comprises brushes of nonconductive material, and wherein said conveying means comprise a plurality of opposed roller pairs along said path outside of said bath zone, with one roller of each said pair being mounted on each side of said path, for board engagement therebetween, and wherein the opposed rollers of each said pair have resilient board-engaging surfaces and are mounted for rotation relative to each other to be interference fit with a board upon receiving a board therebetween, and wherein one roller in each said pair is a driving roller and the other roller in each said pair is an idler roller, with a plurality of said idler rollers being mounted for rotation in a common frame, and wherein means are provided for adjustably positioning said frame laterally toward and away from said path, for accommodating boards of different thicknesses, and wherein said means for making electrical contact with the boards includes an elongate continuous conductor carried by mounting means on each side of the upper end of said board path, with said conductors each having a plurality of conductive spring fingers carried serially thereby and extending transversely into the path of the upper ends of said boards for making electrical engagement with said boards, including means for vertically adjustably positioning the means for making electrical contact with the boards, for accommodating boards of different heights, and including upper guide rollers for guiding the upper ends of the boards, in their movement along their path, including lower guide rollers for guiding the lower ends of the boards, in their movement along their path, wherein said delivery means comprises overflow means for discharging electrolyte from said bath zone above the predetermined desired level, sump means for collecting electrolyte thus discharged, and pump means for pumping electrolyte from said sump means to said nozzles.

16. The method of localized electroplating of tabs of printed circuit boards and the like, comprising the steps of:
   providing a bath zone of electrolyte;
   conveying printed circuit boards through the bath, in generally upright disposition, along a predetermined generally vertical path, with the tabs being carried through the bath;
   delivering through a bank of nozzles along the path to the bath zone, a sufficient flow of electrolyte, to maintain a bath depth of a predetermined desired level;
   wiping the printed circuit boards against electrolyte contact as they are delivered along their path, with the wiping being done at a level just above that of the bath depth;
   automatically and serially engaging portions of the boards and making electrical contact therewith out of the level of the bath, as the boards are carried through the bath, thereby making the board tabs function as electrodes in the electrolyte bath;
   making an electrical connection with the nozzles and causing them to function as immersed electrodes, and
   generating an electrical potential between the electrodes.

17. The method of claim 16, including the steps of guiding the printed circuit boards along their upper and lower edges as they are carried along the path.

18. The method of claim 16, including the steps of engaging the printed circuit boards in interference fit relation serially, by means of rollers, for driving the boards along their path.

19. Apparatus for localized treatment of tabs of printed circuit boards and the like, comprising:
   means defining a treatment zone;
   conveying means for conveying the tabs of printed circuit boards on lower ends thereof, through the treatment zone, with the boards in generally upright disposition along a predetermined generally vertical path;

delivery means for delivering a treatment fluid to boards in the treatment zone; with said conveying means comprising a plurality of opposed roller pairs along said path outside of said treatment zone, with one roller of each said pair being mounted on each side of said path, for board engagement therebetween; and with the opposed rollers of each said pair having board-engaging surfaces and are mounted for rotation relative to each other to be in board-gripping relationship with a board upon receiving a board therebetween, and with said delivery means including means for driving rollers.

20. The apparatus of claim 19, wherein one roller in each said pair is a driving roller and the other roller in each said pair is an idler roller, with a plurality of said idler rollers being mounted for rotation in a common frame, and wherein means are provided for adjustably positioning said frame laterally toward and away from said path, for accommodating boards of different thicknesses.

* * * * *